(12) United States Patent
Morin

(10) Patent No.: US 7,648,758 B2
(45) Date of Patent: *Jan. 19, 2010

(54) LOW DIELECTRIC LOSS COMPOSITE MATERIAL

(75) Inventor: Brian G. Morin, Greenville, SC (US)

(73) Assignee: Innegrity, LLC, Greer, SC (US)

( * ) Notice: Subject to any disclaimer, the term of this patent is extended or adjusted under 35 U.S.C. 154(b) by 11 days.

This patent is subject to a terminal disclaimer.

(21) Appl. No.: 11/671,698

(22) Filed: Feb. 6, 2007

(65) Prior Publication Data

US 2008/0187734 A1    Aug. 7, 2008

(51) Int. Cl.
*D02G 3/00* (2006.01)
*D04H 1/00* (2006.01)

(52) U.S. Cl. .................. 428/292.1; 428/364; 428/365; 428/219; 428/374; 442/117; 442/199

(58) Field of Classification Search ............ 428/292.1, 428/297.4, 299.7, 299.4, 300.4, 301.4, 219; 524/553; 442/199
See application file for complete search history.

(56) References Cited

U.S. PATENT DOCUMENTS

| | | | |
|---|---|---|---|
| 3,620,903 A | 11/1971 | Bunting, Jr. et al. | |
| 3,859,158 A | 1/1975 | Park | |
| 3,996,404 A | 12/1976 | Matsumoto et al. | |
| 4,683,165 A | 7/1987 | Lindemann et al. | |
| 4,882,223 A | 11/1989 | Aptel et al. | |
| 4,886,578 A | 12/1989 | Hendren et al. | |
| 4,985,293 A | 1/1991 | Keep | |
| 4,997,702 A | 3/1991 | Gazit et al. | |
| 5,093,435 A | 3/1992 | Harris et al. | |
| 5,190,997 A | 3/1993 | Lindemann et al. | |
| 5,274,026 A * | 12/1993 | Benedikt et al. ............ 524/553 |
| 5,356,691 A | 10/1994 | Yamamoto et al. | |
| 5,496,613 A | 3/1996 | Middelman et al. | |
| 5,571,609 A | 11/1996 | St. Lawrence et al. | |
| 5,599,611 A | 2/1997 | Afzali-Ardakani et al. | |
| 5,667,743 A | 9/1997 | Tai et al. | |

(Continued)

OTHER PUBLICATIONS

Executive Summary—*International Technology Roadmap for Semiconductors*, 2003 Edition, 73 pages, public.itrs.net.

(Continued)

*Primary Examiner*—D. Lawrence Tarazano
*Assistant Examiner*—Camie S Thompson
(74) *Attorney, Agent, or Firm*—William S. Parks; Wyatt, Tarrant & Combs, LLP

(57) ABSTRACT

Disclosed are composite materials that can exhibit low transmission energy loss and can also be temperature resistant. The composites include reinforcement fibers held in a polymeric matrix. The polymeric matrix can include an amorphous polymer component. Also disclosed are methods of forming the composites. Methods can include forming amorphous thermoplastic polymer fibers, forming a fabric from the fibers, combining the fabric with reinforcement fibers, and molding the structure thus formed under heat and pressure such that the amorphous thermoplastic polymer flows and forms a polymeric matrix incorporating the reinforcement fibers. The composites can be molded from multi-layer structures that can include layers of differing materials, for instance layers formed of polyaramids, fiberglass, or carbon fiber wovens or nonwovens. The composites can advantageously be utilized in low loss dielectric applications, such as in forming circuit board substrates, radomes, antennas, and the like.

33 Claims, 8 Drawing Sheets

A

B

C

▓ Amorphous thermoplastic polymer layer

▨ Reinforcement fiber layer

U.S. PATENT DOCUMENTS

| | | | |
|---|---|---|---|
| 5,858,887 | A | 1/1999 | St. Lawrence et al. |
| 5,972,811 | A | 10/1999 | St. Lawrence et al. |
| 6,071,836 | A | 6/2000 | St. Lawrence et al. |
| 6,337,379 | B2 | 1/2002 | Matsukura et al. |
| 6,440,558 | B2 | 8/2002 | Klaus et al. |
| 6,492,443 | B1 * | 12/2002 | Kodemura et al. ......... 524/114 |
| 6,539,596 | B1 | 4/2003 | Hwo et al. |
| 6,657,005 | B1 | 12/2003 | Nishihata et al. |
| 6,701,703 | B2 | 3/2004 | Patrick |
| 6,866,912 | B2 | 3/2005 | Higgins et al. |
| 6,887,943 | B2 | 5/2005 | Onoe et al. |
| 6,890,965 | B1 | 5/2005 | Johnson et al. |
| 6,929,848 | B2 | 8/2005 | Samuels et al. |
| 6,953,619 | B2 * | 10/2005 | Dean et al. ............ 428/297.4 |
| 6,980,076 | B1 | 12/2005 | Rolling et al. |
| 7,074,483 | B2 | 7/2006 | Morin |
| 2005/0260911 | A1 | 11/2005 | Ochi et al. |
| 2005/0287239 | A1 | 12/2005 | Joo et al. |
| 2006/0135668 | A1 * | 6/2006 | Hayes ..................... 524/430 |
| 2006/0246284 | A1 * | 11/2006 | Oh et al. .................. 428/364 |
| 2007/0039683 | A1 | 2/2007 | Morin |
| 2007/0042170 | A1 | 2/2007 | Morin |
| 2007/0292674 | A1 * | 12/2007 | Morin ................... 428/292.1 |

OTHER PUBLICATIONS

Overview of EIA Annual Energy Outlook 2004 with Projections to 2025, 2004, 8 pages, www.eia.doe.gov.

Presentation entitled *No Exponential is Forever . . . but We Can Delay Forever* by Gordon E. Moore at the International Solid State Circuits Conference, 2003, 29 pages, www.intel.com.

Presentation entitled *Signal Integrity Characterization of Printed Circuit Board Parameters* by Patel et al. at DesignCon 1999, 2002, 8 pages, www.teradyne.com.

Press Release from BP Global entitled *BP to Launch Next Generation Self-Reinforced Composites*, Mar. 16, 2001, 2 pages, www.bp.com.

Product Data on Cyclic Olefin Copolymer (COC) from Topas®, Mar. 2006, 20 pages.

Product Data on Noryl® EN265 from GE Plastics, Oct. 2001, 3 pages.

Product Data on Ultem® 1000 from GE Plastics, Apr. 2003, 4 pages.

Non-Final Rejection in co-pending U.S. Appl. No. 11/671,722, dated May 14, 2009.

* cited by examiner

A        B        C

▦ Amorphous thermoplastic polymer layer

▨ Reinforcement fiber layer

LOW DIELECTRIC LOSS COMPOSITE MATERIAL

BACKGROUND

Formable composites are known for use in electrical applications. These composites are generally utilized as supporting substrates, insulating layers, and/or casements for electrical devices. Ideally, the composite materials provide excellence with regard to both electrical and mechanical properties, e.g., high circuit density, low transmission energy loss, high strength, low weight, etc., and provide all desired characteristics at low cost. Problems still exist with attaining this ideal, however.

Formable composite materials generally include reinforcement fibers held in a polymer matrix, often with additional components as well to improve characteristics such as thermal conductivity, adhesion, color, etc. Unfortunately, components that make up a composite, while supporting one or more desired properties, often detract from others. For instance, glass fibers can offer excellent tensile strength characteristics, but have a dielectric constant of about 6, and thus are often unsuitable for low transmission energy loss applications, particularly if used in abundance. Other fibers that have been used in forming reinforced composite materials have included aramid fibers such as Kevlar™ fibers and ultra-high molecular weight polyethylene (UHMWPE) fibers. These reinforcement materials likewise present drawbacks to a composite such as high material or processing costs, low thermal resistance, high dielectric loss, and the like.

In an attempt to mitigate problems associated with high strength fibrous reinforcement materials, fibers have been combined with resins that exhibit, for instance, desirable electrical characteristics, low costs, etc., to form composites having more acceptable electrical as well as physical properties. For instance, epoxy resins have often been utilized due to their good processability and low costs, though with a dielectric constant in the range of 3.0 to 3.5, the composite materials formed with an epoxy resin can still exhibit less than ideal electrical characteristics.

Fluoropolymers have also been examined as possible matrix material for a composite electrical substrate. For instance, fiber-reinforced composites formed with a poly(tetrafluoroethylene)-based matrix have obtained improved electrical properties over epoxy composites, e.g., dielectric constants less than 2.5 and loss tangents (i.e., dielectric loss) less than 0.002, but have done so at the sacrifice of mechanical characteristics. Moreover, fluoropolymers are often expensive and difficult to process, increasing the costs associated with such composites.

While there have been improvements in materials and methods for forming composites for use in electrical applications, there remains room for further improvement and variation within the art.

SUMMARY

In one embodiment, the present disclosure is directed to a composite material including a polymeric matrix and reinforcement fibers contained within the polymeric matrix. More specifically, the polymeric matrix includes a polymer including an amorphous polymer as at least a component of the polymer. The polymeric matrix includes this polymer in an amount of at least about 80% by weight of the polymeric matrix. For example, the matrix can include a cyclic olefin copolymer. The reinforcement fibers can be, for example, glass fibers, quartz fibers, and the like. In one embodiment, the composite material can include reinforcement fibers that are interwoven, for instance in the form of a fiberglass fabric. In another embodiment, the composite material can include reinforcement fibers that are in a more random distribution, for instance relatively short fibers that have been laid down in a nonwoven fabric formation process.

The polymer used in forming the matrix can exhibit excellent electrical properties for various applications. For example, the polymer can have a dielectric constant less than about 2.9, or les than about 2.75 in another embodiment. In one embodiment, the polymer can have a dissipation factor of less than about $1 \times 10^{-3}$, or less than about $1 \times 10^{-4}$, in another embodiment. Accordingly, the composite material can be a low dielectric loss material, for example, the composite material can have a dielectric constant of less than about 4.0, or less than about 3.5, in another embodiment. The composite material can also have a low dielectric loss, for instance less than about 0.004, or less than about 0.002.

The disclosure is also directed to molded substrates that can be formed from disclosed composite materials. Disclosed molded substrates can exhibit desirable mechanical characteristics. For instance, a molded substrate as disclosed herein can have a flexural modulus of greater than about 9 GPa. Disclosed substrates can have a low density, for instance less than about 1.5 g/cm$^3$.

A molded substrate can be utilized in various application, for instance in a circuit board substrate, in a radome, or in an antenna. A molded circuit board substrate can include an electric circuit in or on the substrate, for example a printed circuit on a surface of the molded substrate. In one particular embodiment, the molded substrate can be a monolithic structure. For instance, a single polymeric matrix can extend across the entire substrate from a first surface to a second opposing surface. In one embodiment, the molded substrate can include a fairly even distribution of reinforcement fibers throughout the substrate. In another embodiment, the molded substrate can include a higher concentration of reinforcement fibers and/or the polymeric matrix in a predetermined area of the substrate. For example, an outer edge of a substrate can have a higher proportion of polymeric matrix, with one or more areas within the substrate having a higher proportion of reinforcement fibers. In another embodiment, an outer area of a molded substrate can have a higher proportion of reinforcement fibers, for instance in those embodiments in which a woven reinforcement fiber fabric has been included in an outer area of the formation.

The disclosed subject matter also encompasses methods of forming composite materials. For example, a method can include providing a first layer. Incorporated in the first layer can be polymeric fibers. A polymer of the polymeric fibers can include an amorphous thermoplastic component. A method can also include providing reinforcement fibers. For instance, reinforcement fibers can be provided in the first layer in conjunction with the polymeric fibers or in a second layer. The first layer and the reinforcement fibers can be placed under pressure at increased temperature. In particular, the materials can be heated to a temperature that is at least about equivalent to the glass transition temperature of the amorphous thermoplastic polymer. Upon heating, the polymer can flow and become incorporated into a polymeric matrix. The reinforcement fibers can thus then be confined within the formed polymeric matrix.

In one embodiment, a plurality of layers can be provided, at least one of which includes the polymeric fibers. The plurality of layers can be formed into a stacked arrangement. Individual layers of the stacked arrangement can be, for instance, films or fabrics. For example, the first layer can be a woven or a nonwoven fabric that includes fibers of the amorphous thermoplastic polymer. The stacked arrangement can then be placed under heat and pressure to form the polymeric matrix and mold the formed composite material.

In other embodiments, the formation can include forming the first layer, e.g., forming the woven or nonwoven fabric. Other embodiments can also include forming the polymeric fibers of the fabric layer.

BRIEF DESCRIPTION OF THE FIGURES

A full and enabling disclosure of the present disclosure, including the best mode thereof, to one of ordinary skill in the art, is set forth more particularly in the remainder of the specification, including reference to the accompanying Figures in which.

Figure 1:
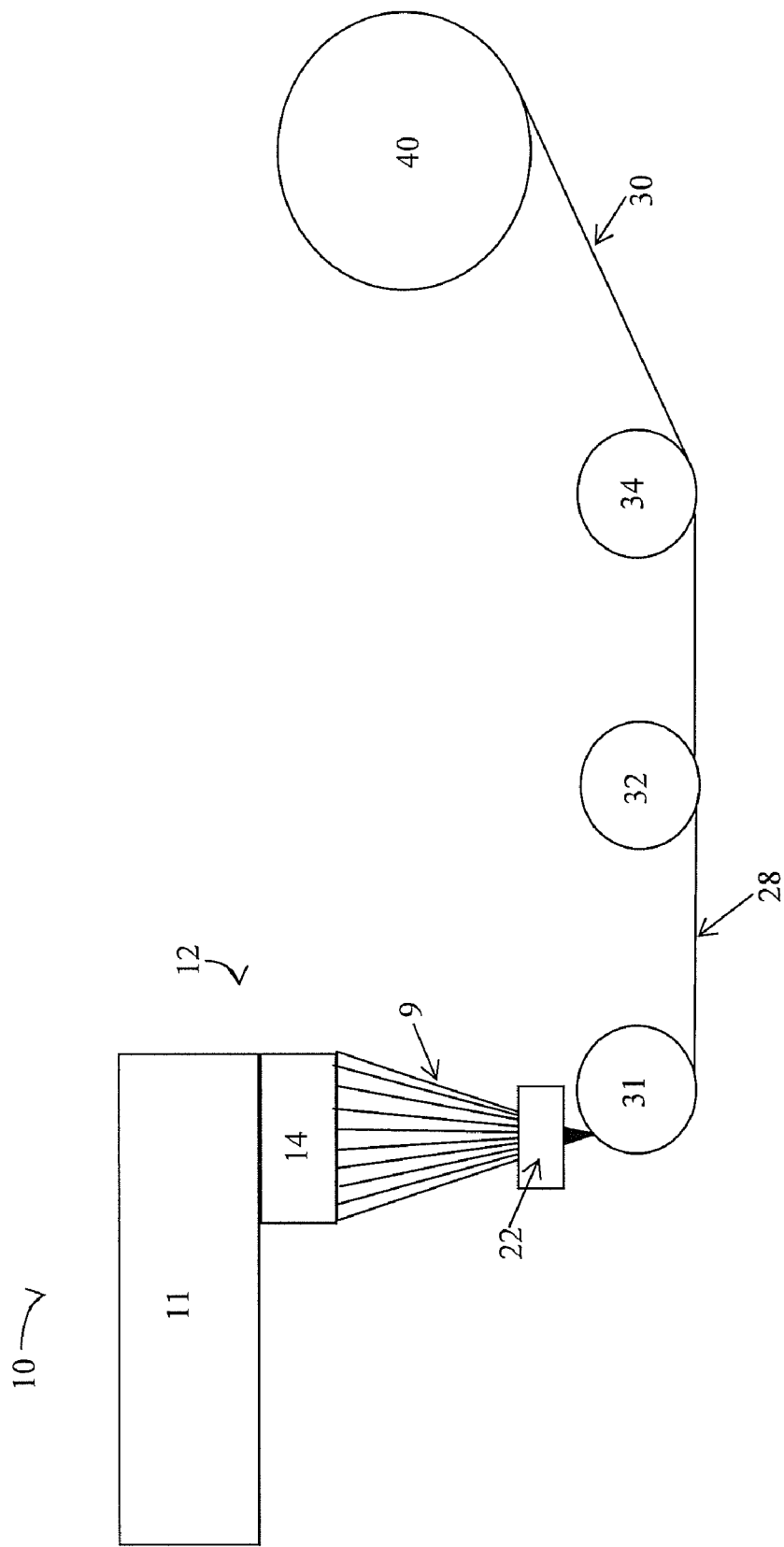
FIG. 1 is a schematic representation of one method of forming amorphous thermoplastic fibers as may be used in forming a composite material as disclosed herein.

Repeat use of reference characters in the present specification and drawings is intended to represent the same or analogous features or elements.

DETAILED DESCRIPTION OF PREFERRED EMBODIMENTS

Reference will now be made in detail to various embodiments of the disclosed subject matter, one or more examples of which are set forth below. Each embodiment is provided by way of explanation, not limitation of the subject matter. In fact, it will be apparent to those skilled in the art that various modifications and variations can be made to the disclosed subject matter without departing from the scope or spirit of the disclosure. For instance, features illustrated or described as part of one embodiment, can be used in another embodiment to yield a still further embodiment. It is intended that the present disclosure cover such modifications and variations as come within the scope of the appended claims and their equivalents.

Definitions

As used herein, the term 'amorphous polymer' generally refers to a polymer that does not exhibit any degree of crystallinity. In particular, amorphous polymers exhibit no temperature of crystallization and no melting temperature.

As used herein, the term 'semi-crystalline polymer' generally refers to a polymer that can exhibit a crystalline structure. In particular, it should be understood that though semi-crystalline polymers can be found in an amorphous state, they are not amorphous polymers. Hence, the amorphous state of a semi-crystalline polymer should not be confused with an amorphous polymer.

A semi-crystalline polymer can exhibit crystalline structure, while an amorphous polymer cannot. In particular, a semi-crystalline polymer can be made to exhibit a crystalline reflection pattern when observed under wide angle x-ray scattering, characterized by a pattern of x-ray scattering spots or rings, from which symmetry or other characteristics of the crystalline phase of the material can be determined. An amorphous polymer will only exhibit much broader amorphous halos, though some broad ring structure may be present. These patterns are well known to those skilled in the art of polymer morphology.

As used herein, the term 'fiber' generally refers to a structure that exhibits a length that exceeds the largest cross-sectional dimension (such as, for example, the diameter for round fibers). Thus, the term fiber as utilized herein differs from other structures such as plaques, containers, sheets, films and the like. The term is intended to encompass structures including monofilament fibers, multi-filament fibers, yarns, tape fibers, and the like.

As used herein, the term 'multi-filament yarn' generally refers to a structure that includes at least three filaments that have been individually formed such as via extrusion through a spinneret prior to being brought in proximity to one another to form a single yarn structure.

The term 'composite yarn' generally refers to a yarn formed from the combination of two different fiber types.

The term 'fabric' generally refers to any planar textile structure produced by the interlacing or other combination of yarns, multi-filament fibers, monofilament fibers, or some combination thereof.

DETAILED DESCRIPTION

In general, the present disclosure is directed to low transmission energy loss composite materials for use in electrical applications such as circuit boards, insulators, electronic packages, antennas, wireless devices or housings, radomes, and the like. The composites include reinforcement fibers held in a polymeric matrix. More specifically, the polymeric matrix can include one or more amorphous thermoplastic polymers. The disclosure is also directed to methods of forming the disclosed composites. For instance, one or more fabrics including amorphous thermoplastic fibers can be held under heat and pressure with reinforcement fibers such that the amorphous thermoplastic fibers begin to lose their physical integrity and flow. The formed product can then include a plurality of reinforcement fibers held in a polymeric matrix including an amorphous thermoplastic polymer.

Composites as described herein can exhibit improved characteristics as compared to previously known composite materials. For instance, the disclosed composites can exhibit very low transmission energy loss and high thermal resistivity while being economical to produce.

Amorphous thermoplastic polymers encompassed by the present disclosure can include any thermoplastic polymer including at least one polymeric component that exhibits no crystallization temperature. For example, amorphous thermoplastic polymers encompassed herein can exhibit only amorphous halo type scattering when observed under wide angle x-ray scattering and a distinct absence of crystalline rings or spots. In one embodiment, an amorphous thermoplastic polymer can exhibit a glass transition temperature greater than about 75° C., greater than about 100° C., greater than about 140° C., or greater than about 200° C. in other embodiments. Amorphous polymers for use in one embodiment can also have a low thermal expansion, for instance less than about 100 ppm/° C. or less than about 60 ppm/° C. in another embodiment. Amorphous thermoplastic polymers can include, without limitation, polymethyl methacrylate (PMMA), atactic polystyrene, cyclic olefin copolymers, polycarbonate, polyetherimides, polyisoprene, polybutadiene, and the like. One exemplary cyclic olefin copolymer as may be used in forming embodiments of the presently disclosed composite materials is Topas® resin, available from Topas Advanced Polymers Inc., of Florence, Ky. USA.

Amorphous thermoplastic polymers for use as described herein can be of any standard melt flow. For example, standard extrusion grade cyclic olefin copolymer (COC) resin possessing ranges of melt volume flow rate (MVR) between about 1 and about 30 can be utilized. In one embodiment, COC possessing an MVR between about 2 and about 10 can be utilized. In one embodiment, the COC utilized in forming the fibers can have an MVR between about 3 and about 7.

Amorphous thermoplastic polymers of the disclosed composites can describe a low dielectric constant and/or a high glass transition temperature. For example, amorphous thermoplastic polymers as may be utilized in certain embodiments can have a dielectric constant of less than about 3.2 in some embodiments, less than about 2.9, or even lower in other embodiments, for instance less than about 2.75, or less than about 2.6. Amorphous thermoplastic polymers for use herein can have a low dielectric loss, for instance less than about 0.0008, or less than about 0.0005, or less than about 0.0002 in other embodiments. The polymers can also have a low dissipation factor (=dielectric loss/dielectric constant). For instance, the amorphous thermoplastic polymers can have a dissipation factor of less than about $1 \times 10^{-3}$, or less than about $1 \times 10^{-4}$, in another embodiment Amorphous thermoplastic polymers used in one embodiment of the composite materials can have good mechanical characteristics. For instance amorphous thermoplastic polymers can have a tensile modulus of more than about 2.5 GPa, more than about 2.8 GPa, or more than about 2.9 GPa, in various embodiments. Amorphous thermoplastic polymers of some embodiments can describe high tensile strengths, for instance greater than about 40 MPa, or greater than about 50 MPa in other embodiments.

Amorphous thermoplastic polymers can be utilized in any combination or configuration with other polymers. For instance, the amorphous polymers can be either homopolymers or copolymers, as desired. Moreover, copolymers can include random, block, or graft copolymers, as desired. For instance, a cyclic olefin copolymer can be utilized. In another embodiment, a blend of polymers can be utilized, as is generally known in the art. Thus, as used herein, the term 'amorphous thermoplastic polymer' is generally intended to refer to either an amorphous thermoplastic homopolymer or a copolymer including at least one amorphous thermoplastic polymeric component on the polymer.

When considering copolymers and blends of polymers, the materials can include a semi-crystalline polymer component in addition to the amorphous thermoplastic component. For instance, a polymeric matrix can include a copolymer including an amorphous component and a semi-crystalline component. Similarly, the polymeric matrix can include a polymer blend including an amorphous polymer, e.g., atactic polystyrene, blended with a semi-crystalline polymer, e.g., polypropylene. In such embodiments, however, the semi-crystalline component will be present in amounts such that the formed composite material exhibits the desired characteristics, discussed in more detail below.

An amorphous thermoplastic blend or copolymer including a semi-crystalline polymer component may exhibit crystalline scattering under wide angle x-ray scattering. One such blend, by way of example only, would be a cyclic olefin copolymer blended with polypropylene. A polymer blend including at least one amorphous thermoplastic polymer component may exhibit superior characteristics related to, e.g., processing, formation, and tensile properties while retaining significant thermal stability and low dielectric constant and loss.

In one embodiment, a molded composite material can be formed from polymeric fibers that include an amorphous polymer. Fibers used to form a composite as disclosed herein can be monofilament fibers, multifilament fibers, tape fibers, or the like, and can be formed according to any suitable process. One embodiment of a process 10 for forming amorphous polymer multifilament fibers is schematically illustrated in FIG. 1.

According to this embodiment, a polymeric composition can be provided to an extruder apparatus 12. The polymeric composition can include one or more amorphous thermoplastic polymers as well as any other polymer and/or desired additives as are generally known in the art. For example, the mixture can include suitable coloring agents, such as dyes or other pigments. Other additives that can be combined with the mixture can include, for example, one or more of anti-static agents, antioxidant agents, antimicrobial agents, adhesion agents, stabilizers, plasticizers, brightening compounds, clarifying agents, ultraviolet light stabilizing agents, nucleating agents, surface active agents, odor enhancing or preventative agents, light scattering agents, halogen scavengers, and the like. In addition, additives can be included in the extrusion mixture or can be applied as a surface treatment to either the undrawn formation or optionally to the drawn material.

In one embodiment, an additive can be included that can leave reactive groups on the surface of the extrusion product. Reactive groups can be added, for example, that can improve the adhesion of the extrusion product, e.g., the fiber, to other materials utilized in forming the composite structures. For example, maleic anhydride can be included in a polymeric mixture that can leave functional groups on the surface of the fibers capable of reacting with other polymeric materials that may be included in the composite structure, e.g., unsaturated polyester resins.

The extruder apparatus 12 can be a spinneret apparatus. For example, the extruder apparatus 12 can include a mixing manifold 11 in which a polymeric composition can be combined, mixed and heated to form an extrudable composition. The mixture can then be conveyed under pressure to the spinneret 14 where it can be extruded at a high temperature through multiple spinneret orifices to form multiple filaments 9.

Following extrusion, a lubricant can be applied to the fibers. For example, a spin finish can be applied at a spin finish applicator chest 22, as is generally known in the art. Any suitable lubricant can be applied to the filaments 9. In one particular embodiment, a low loss spin finish can be applied to the filaments 9, optionally in conjunction with a scour process, for instance a hot water scour either alone or in conjunction with a detergent. For example, a suitable oil-based finish such as Lurol PP-912, available from Ghoulston Technologies, Inc. can be applied to the filaments 9. Addition of a finishing or lubricant coat can improve handling of a fiber bundle during subsequent processing and can also reduce friction and static electricity build-up on a finished yarn. In addition, a finish coat on a yarn can improve slip between individual filaments of the yarn during a drawing process and can increase the attainable draw ratio, and thus increase the modulus and tenacity of a drawn multi-filament yarn.

The filaments 9 can be gathered to form a fiber bundle 28 that can then be drawn. For instance, the fiber bundle 28 can be drawn utilizing a series of heated godet rolls 31, 32, 34. It should be understood that any suitable process that can place a force on the yarn so as to elongate the yarn can optionally be utilized. For example, any mechanical apparatus including nip rolls, godet rolls, steam cans, air, steam, or other gaseous jets can optionally be utilized to draw the yarn. As is known in the art, applying heat during the drawing step can facilitate a uniformly drawn yarn. Following the yarn drawing step, the drawn multi-filament yarn 30 can be wound on a take-up roll 40.

In one embodiment, a finished multi-filament yarn 30 can be wound on a spool or take-up reel 40, as shown, and transported to a second location for formation of the composite materials. In an alternative embodiment, a multi-filament yarn can be fed directly to a second processing line, where the yarn can be further processed.

One exemplary extruded multifilament yarn as may be formed and used to form a composite material can have a diameter of about 20 μm, a linear mass density of about 3.1 denier/filament and can exhibit excellent mechanical properties including about 20% elongation, a modulus of about 60 g/d, and a tenacity of about 2.0 g/d.

Fibers for use in forming the disclosed composite materials are not limited to homogeneous multi-filament fibers formed according to the above-described process. For instance, amorphous thermoplastic polymer fibers can be extruded that can include discrete sections formed of different compositions that can differ as to polymer, additives, or a combination thereof. For example, two or more compositions can be extruded to form fibers having a core/shell arrangement. In another embodiment, fibers can vary in composition along the length of the fiber, with adjacent lengths of the fibers being formed of different compositions.

Moreover, fibers useful in forming the disclosed composites are not limited to extruded fibers. The disclosed composites can be formed from fibers cast from a solvent in a wet spinning process or formed in a dry spinning process and then oriented through drawing as described above.

In another embodiment, amorphous thermoplastic polymers can be initially formed as a film. According to this embodiment, a polymeric film including one or more amorphous thermoplastic polymers can be formed according to any known film-formation process. Following formation, a film can be utilized as is in forming a composite material or may be first processed to form amorphous polymer fibers that can then be utilized in forming the composite material, as desired.

Figure 2:
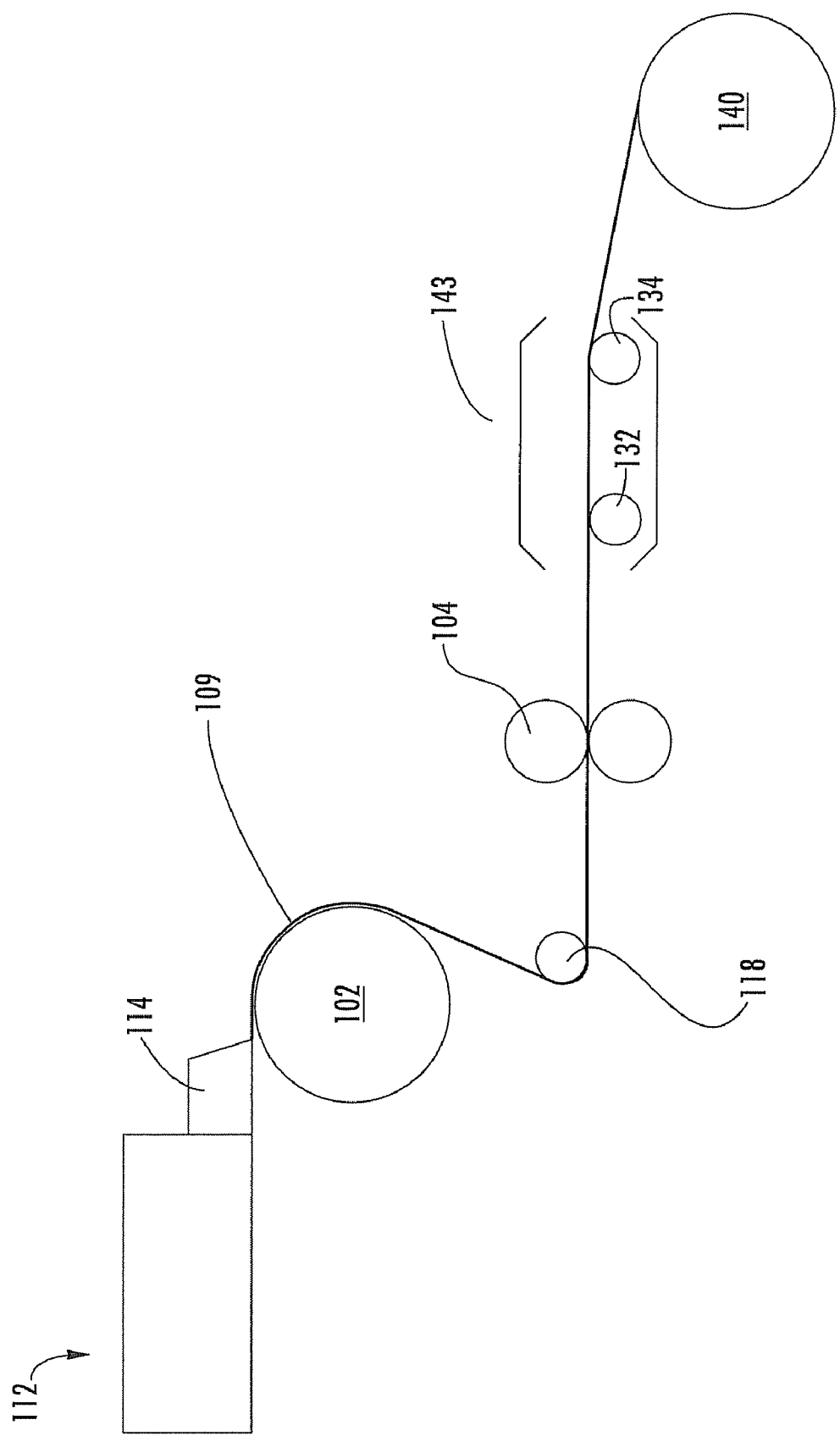
FIG. 2 is a schematic representation of one method of forming an amorphous thermoplastic extruded film that can be utilized in forming a composite material as disclosed herein.

One embodiment for forming an extruded film is schematically illustrated in FIG. 2. As can be seen, according to this embodiment, a polymeric composition can be provided to the extruder apparatus 112, and can be extruded through a die 114 in the form of a film or sheet 109. The thickness of the film 109 can generally be chosen according to the desired end use and can be achieved by control of the process conditions. For example, the film 109 can have a thickness in one embodiment of less than 100 mils (2.5 mm). In one embodiment, the film 109 can have a thickness between 2 and 20 mils (0.05 to 0.5 mm). However, depending on the characteristics desired, the film 109 can optionally be cast at thicknesses outside of this range.

Following extrusion, the film 109 can be quenched on a heated casting drum 102. Quenching on a heated casting drum is not a requirement, however, and in other embodiments, the film may be quenched in air or in a fluid such as water, which may be heated.

After casting (and drawing, if any), the film 109 can be calendered, as at 104. The formed film 109 can then be drawn under conditions that are below those at which catastrophic failure of the film could take place. In one embodiment, when considering both the calendering and drawing steps, the combined draw ratio can be at least about 2:1. In one embodiment, the combined draw ratio for an amorphous polymer film can be between about 3:1 and about 5:1.

As with the multi-filament fiber forming process discussed above, a film draw can be performed cold and/or at an elevated temperature, for instance in heated bath, using heated draw rolls, or the like. In addition, a draw step can utilize two draw rolls, 132, 134, as illustrated, or optionally multiple draw rolls as well as any other suitable drawing method.

Following any draw step, a film 109 can be collected on a roll 140 for additional processing or optionally immediately sent to a second line for additional processing. The final thickness of a film can generally be determined by combination of the casting thickness, the calendering thickness and the draw ratio. In one embodiment, the final thickness of an amorphous thermoplastic film can be between about 1 and about 20 mils (about 0.025 to about 0.5 mm). In another embodiment, the film thickness can be between about 3 and about 10 mils (about 0.075 to about 0.25 mm).

The above process is an exemplary process only, and films including an amorphous thermoplastic polymer can be formed according to any film forming process as is generally known in the art including, without limitation, other extrusion methods or casting methods including solution casting methods such as spin casting.

Following formation of an amorphous thermoplastic film, the film can be further processed to form tape fibers. For example, the film can be sliced or cut according to methods as are generally known in the art so as to form a plurality of tape fibers.

The formed amorphous thermoplastic fibers or films can have a low dielectric constant as well as a low dielectric loss. For example, the dielectric constant of the formed materials can be below about 3.5, or below about 2.5, or even below about 2.2 in some embodiments.

In addition, the polymeric material can be thermally resistant. For instance, the polymeric fibers or films can have a glass transition temperature greater than about 140° C. In a preferred embodiment, the polymeric materials can have a glass transition temperature greater than about 160° C.

Following initial formation, amorphous thermoplastic polymeric fibers can be combined with reinforcement fibers and then molded under heat and pressure to form a molded composite material. Reinforcement fibers can include any fibrous material as is known in the art such as, without limitation, glass fibers, quartz fibers, carbon fibers, ultra high molecular weight polyethylene (UHMWPE) fibers, high modulus polypropylene (HMPP) fibers, fluorocarbon-based fibers such as polytetrafluoroethylene (PTFE) fibers, polyaramid fibers such as poly-paraphenylene terephthalamide (e.g., Kevlar®)) fibers, combinations of reinforcement fibers, high strength metal fibers and the like.

In one embodiment, fibers including an amorphous thermoplastic polymer can formed in a fabric. For instance, amorphous thermoplastic polymer fibers can be included in a fabric formed according to a predetermined, organized, interlaced pattern, herein referred to as a weave fabric (i.e., a fabric formed according to a weaving and/or knitting process). Alternatively, fibers can be included in a fabric formed according to a random pattern (a nonwoven fabric).

A weave fabric can be formed according to any textile formation process and utilizing any weaving and/or knitting textile formation systems and devices as are generally known in the art that are suitable for use with amorphous polymer fibers. For example, amorphous polymer fibers can be in the form of a relatively small yarn, about 40 denier, and the yarn can be incorporated in a weave structure of up to 100 picks per inch in either or both directions. When considering larger fibers or yarns, for example up to about 10,000 denier or even higher, the fibers can be formed into a fabric structure with only about 10 or even fewer picks per inch. In this way, composites of varying physical properties can be prepared. In addition, any weave pattern is acceptable. For example, weave patterns such as twill and satin that are well known in the art can be utilized alone or in combination in forming the disclosed structures.

A nonwoven fabric incorporating amorphous polymer fibers can be formed according to any suitable formation process as is generally known in the art. For example, a nonwoven fabric can be formed by any number of possible methods including, without limitation, carding, wet-laid and dry-laid formation methods. Following initial formation, a nonwoven can be stabilized according to any method(s) as are known in the art including needlepunching, hydroentanglement, thermal bonding, chemical bonding, and the like.

Figure 3:
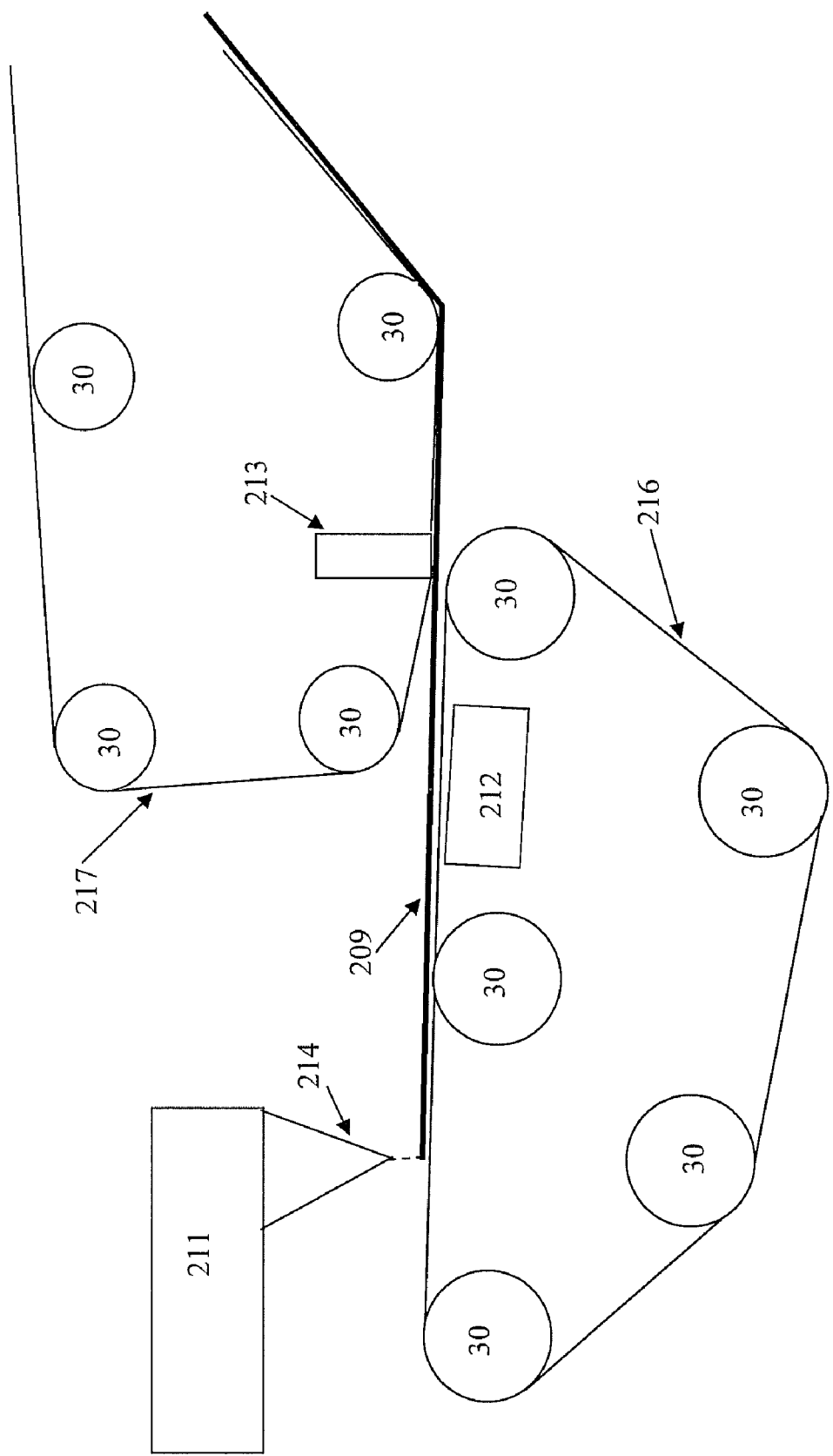
FIG. 3 is a schematic representation of one method of forming a nonwoven fabric as may be utilized in forming a composite material as disclosed herein.

One embodiment of a wet-laid formation process is illustrated in FIG. 3. The process can include providing a fiber slurry to headbox 211. The fiber slurry can include amorphous thermoplastic fibers as described herein as well as any other additives, additional fiber types, and the like. The fiber slurry can generally include fibers of less than about 2 inches in length, for instance between about 0.05 inches and about 1.5 inches, in one embodiment. In general, the fibers can have a diameter of less than about 200 microns, or less than about 100 microns in another embodiment. From the headbox 211, the slurry of fibers can be deposited on an endless forming fabric 216. The nascent nonwoven fabric 209 can be dewatered via gravity and/or via vacuum suction at a dewatering device 212. Following initial dewatering, the wet nonwoven fabric 209 can generally have a ratio of solids to water of between about 1:4 to about 1:8. The wet nonwoven fabric 209 can be transferred to a second traveling endless forming fabric 217. Transfer can generally be carried out via positive or negative pressure, for instance via a vacuum shoe 213. Following transfer, the nonwoven fabric 209 can be dried (not shown), for instance through utilization of steam-heated dryer cans, a forced air through-dryer, or any other method. The nonwoven fabric can be wound on a take-up reel (not shown) or further treated, as desired. For instance, the nonwoven fabric can be needlepunched or hydroentangled according to standard practice to provide fiber orientation, to encourage fiber disorientation, and/or to interlock fibers forming the web.

A formed fabric or fibers used to form a fabric can be treated, for instance to improve wettability or adhesion. For example, a fiber, film or fabric can be fibrillated, subjected to plasma or corona treatments, or treated with a surface sizing, all of which are generally known in the art, to improve or enhance the physical characteristics of the material. In one embodiment, the fibers or fabric can be treated to increase the surface area of the material, for instance via a fibrillation process, so as to improve adhesion between components of a formed composite material. For example, fibers, films, or fabrics can be fibrillated or micro-fibrillated to improve adhesion.

Amorphous polymer fibers, fabrics or films can be treated according to a surface functionalization process, for instance to promote formation of a strong bond between components during the composite formation process. Functionalization may be obtained according to any suitable method. For example, a fiber sizing can be coated onto individual fibers prior to forming a fabric or optionally onto the fabric itself. A suitable sizing can include any sizing that is capable of bonding to the fiber surface while leaving reactive groups for bonding to another component of the composite.

Amorphous polymer fibers, fabrics or films can be oxidized according to any suitable oxidation method including, but not limited to, corona discharge, chemical oxidation, flame treatment, oxygen plasma treatment, or UV radiation. In one particular example, atmospheric pressure plasma such as that created with an Enercon Plasma3™ unit using an 80% helium and 20% oxygen atmosphere at a moderate power level can be formed and a fabric or fiber can be treated with the plasma so as to create reactive groups that can improve wetting and binding of the fibers to other components of the composite structure to be formed.

Reinforcement fibers can be combined with an amorphous thermoplastic polymer prior to a molding process. In one embodiment, a fabric can be formed that includes a mixture of fiber or yarn types. For example, a fabric can be formed including amorphous polymer fibers in combination with glass fibers, carbon fibers, aramid fibers, quartz, polyethylene terephthalate (PET) fibers, liquid crystal polymer fibers, ceramic fibers, quartz fibers, mixtures thereof, or any other reinforcement fiber type as is generally known in the art. The size, total number, direction, and location of the reinforcement fibers in the fabric can improve or define characteristics of the fabric. For example, the flexural and/or tensile strength characteristics of the fabric can be controlled through addition of reinforcement fibers at predetermined locations in the pick and/or warp of the fabric. For instance, the warp fibers can include amorphous thermoplastic polymeric fibers and the weft fibers can include reinforcement fibers, the warp and/or weft fibers can include both types of fibers, or any other combination can be used. When considering a nonwoven fabric, characteristics of the fabric can be controlled through predetermination of the relative amount of reinforcement fibers in the nonwoven fabric, through formation methods that provide orientation or lack thereof to fibers in the web, or through any other method.

In one embodiment, amorphous thermoplastic polymer fibers can be combined with reinforcement fibers to form a composite yarn that can then be included in a fabric. Composite fibers can be formed according to any suitable composite fiber-forming process. For example, two or more fibers can be combined via twisting, false twist texturing, air texturing, or any other yarn texturing or combining process. In one embodiment, a composite yarn can be formed including a high-strength inner fiber, such as a polyaramid fiber, and an outer wrapping including a low dielectric constant, high temperature resistant amorphous thermoplastic polymer. One exemplary method for forming such composite yarns has been described in U.S. Pat. No. 6,701,703 to Patrick, which is incorporated herein by reference.

In another embodiment, a composite yarn can be formed according to an air-jet combinatorial method, such as that described in U.S. Pat. No. 6,440,558 to Klaus, et al., which is also incorporated herein by reference. These are merely exemplary methods, however, and multiple such suitable combinatorial processes are well known to one of ordinary skill in the art, and thus are not described at length herein.

In one embodiment, an amorphous thermoplastic polymer and reinforcement fibers can be provided in separate layers of a multi-layered structure. For example, a plurality of layers, each including both amorphous thermoplastic polymer fibers and reinforcement fibers, can be layered together prior to a molding process. In another embodiment, the various components of the structure can be provided with a less even distribution of the materials. For example, a multi-layered structure can include a first layer that includes relatively more reinforcement fibers and a second layer includes relatively less reinforcement fibers. Reinforcement fibers can be presented in the form of, for instance, fiberglass woven and nonwoven fabrics, carbon fiber wovens and nonwovens, polymeric woven, nonwovens, films, sheets, and the like that can include any of a variety of polymeric reinforcement fibers including, for instance, fiber-reinforced thermoset matrices formed with halogenated reinforcement polymeric fibers (e.g., PTFE, PVC, PVA, etc.), polyaramids (e.g., Kevlar®), UHMWPE, , HMPP and the like.

A film or a fabric incorporating an amorphous thermoplastic polymer can be layered with a second layer that includes reinforcement fibers. For instance a weave fabric can be formed in which both the pick and warp yarns can be polymeric yarns, at least a portion of which include amorphous thermoplastic polymers, and this weave fabric can be layered with a second layer that includes reinforcement fibers. All of the polymeric yarns of such a fabric need not, however, be identical. For instance, individual yarns of a fabric can differ as to polymer make-up, additives, etc.

A fabric of a multi-layered structure that includes reinforcement and/or amorphous polymer fibers can be provided as a prepreg including any traditional polymeric resin matrix such as, without limitation, a vinyl ester resin, an epoxy resin, a polyurethane resin, and the like.

Individual layers of a multi-layered structure can include fillers and/or other reinforcement materials, as are generally known in the art. For example, the structure can include ceramic fillers (e.g., silica) or carbon black. Fillers can be included, for instance, to provide particular electrical or mechanical characteristics to the final composite structure.

Figure 4:
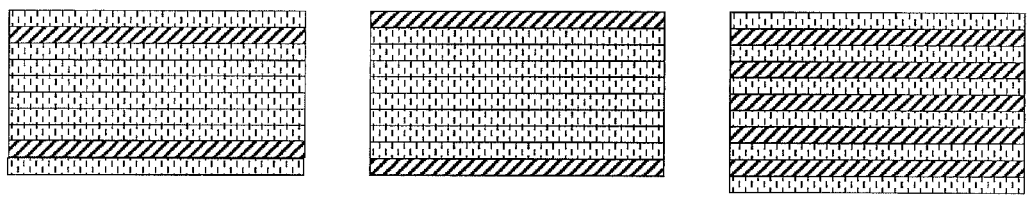
FIG. 4A-4C illustrate some exemplary stacked arrangements of multi-layered structures as described herein.

A plurality of layers can be combined in any fashion to form a multi-layered structure. FIGS. 4A-C illustrate some exemplary multi-layered structures that include first layers that include a larger percentage of amorphous thermoplastic polymer as compared to any reinforcement fibers present in these first layers (marked as 'amorphous thermoplastic polymer layer' on FIG. 4) and second layers that include a larger percentage of reinforcement fibers as compared to any amorphous thermoplastic polymer present in these second layers (marked as 'reinforcement fiber layer' on FIG. 4). The embodiments illustrate in FIGS. 4A-4C will provide a variety of fiber distributions to a finally formed composite material, as can be seen. For instance, the multi-layer structure of FIG. 4A, following compression molding, discussed in more detail below, can provide a structure include areas of high reinforcement fiber concentration within the interior of the structure while the surface areas of the structure can have a relatively high concentration of the amorphous thermoplastic polymer as compared to the reinforcement fiber concentration at the surface.

In the structure of FIG. 4B, in contrast, the ratio of reinforcement fibers to amorphous thermoplastic polymer will be higher near the surface of the structure, and this ratio will be less in the interior areas of the structure.

The structure of FIG. 4C will have the reinforcement fibers distributed relatively evenly across the structure. More specifically, though there may be local areas within the structure having somewhat higher concentration of reinforcement fibers, and specifically the local areas in and around the reinforcement fiber layers, the average concentrate gradient of the reinforcement fibers across the entire cross section of the structure will be about zero. In other words, the concentration gradient of the reinforcement fibers, when taken on average across the entire depth of the structure, will be relatively flat, or about zero. This does not preclude local areas of higher or lower concentrations of materials, however. For instance, with reference to FIG. 4C, in this embodiment, similar to that of FIG. 4A, the structure has a relatively higher concentration of the amorphous thermoplastic polymer at the outer areas of the structure as compared to the amount of reinforcement fibers in this local area, though when considered across the entire structure, the concentration gradient for the reinforcement fibers is about zero, i.e., the reinforcement fibers are evenly distributed across the structure.

Figure 5:
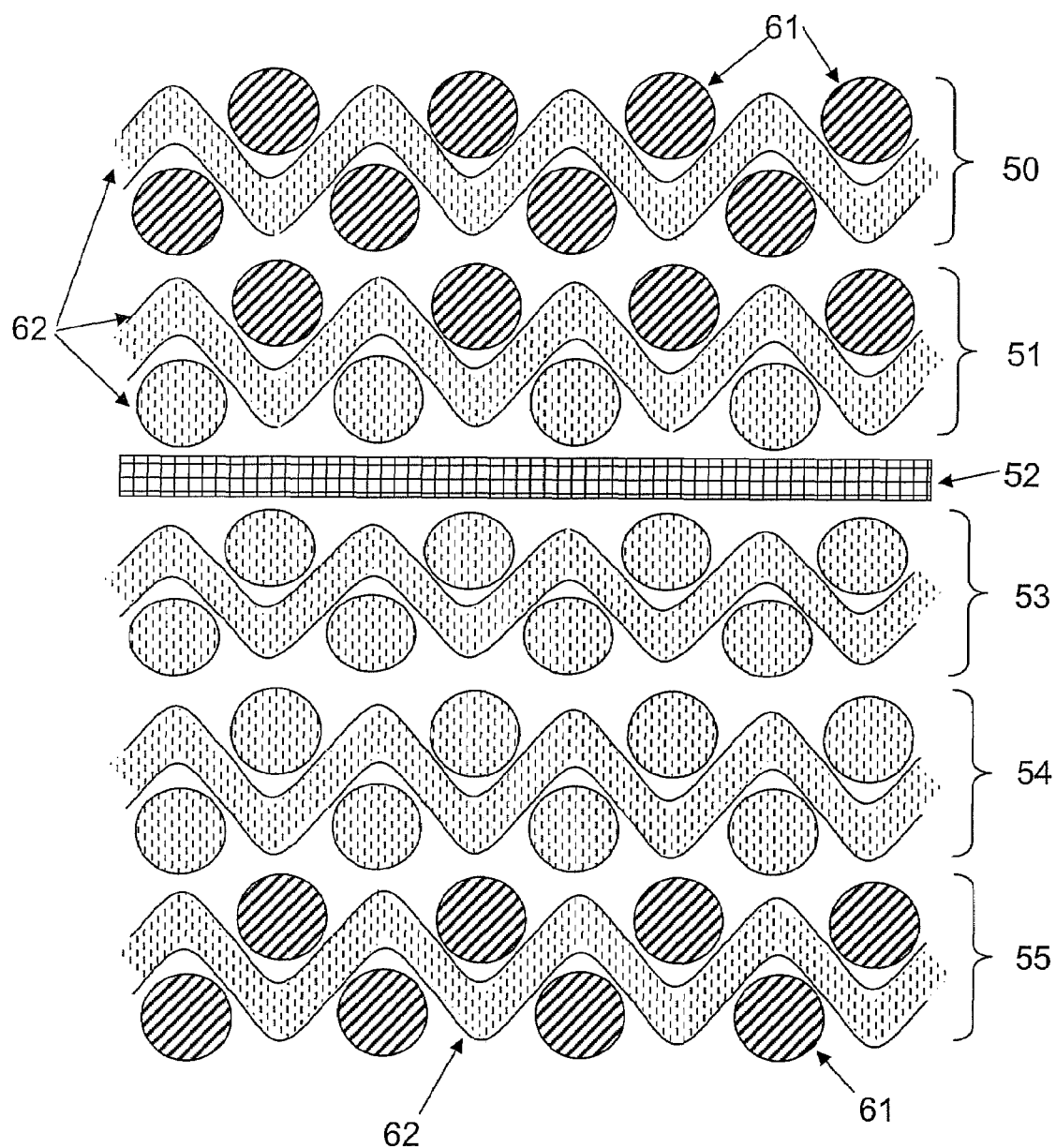
FIG. 5 is a schematic representation of one embodiment of a multi-layered structure as described herein.

One embodiment of a multi-layered structure that may be assembled is schematically illustrated in FIG. 5. As can be seen, the structure includes six layers, 50, 51, 52, 53, 54 and 55. In the illustrated embodiment, the structure includes amorphous thermoplastic fibers 62 and reinforcement fibers 61, that have been formed in various arrangements to form weave fabric layers 50, 51, 53, 54 and 55. The structure also includes a film layer 52. Film 52 can include, for instance, an amorphous thermoplastic polymer, a semi-crystalline polymer, or a combination thereof. Immediately adjacent layers of a multi-layer structure can be the same or different. For instance in fabric layer 53 and fabric layer 54 both the warp and weft fibers are amorphous thermoplastic fibers 62, as can be seen. Layer 50 includes amorphous thermoplastic warp fiber 62 and all weft fibers are reinforcement fibers 61. Layer 51 differs from layer 50 in that the weft fibers include both amorphous thermoplastic fibers 62 and reinforcement fibers 61. The multi-layered structure can include individual fibers and films in a predetermined arrangement to provide particular characteristics to the final molded composite material. For instance, in the embodiment illustrated in FIG. 5, the exterior layers of the multi-layered structure include a high proportion of reinforcement fibers, while the inner layers provide a high proportion of the amorphous thermoplastic polymer fibers.

Figure 7:
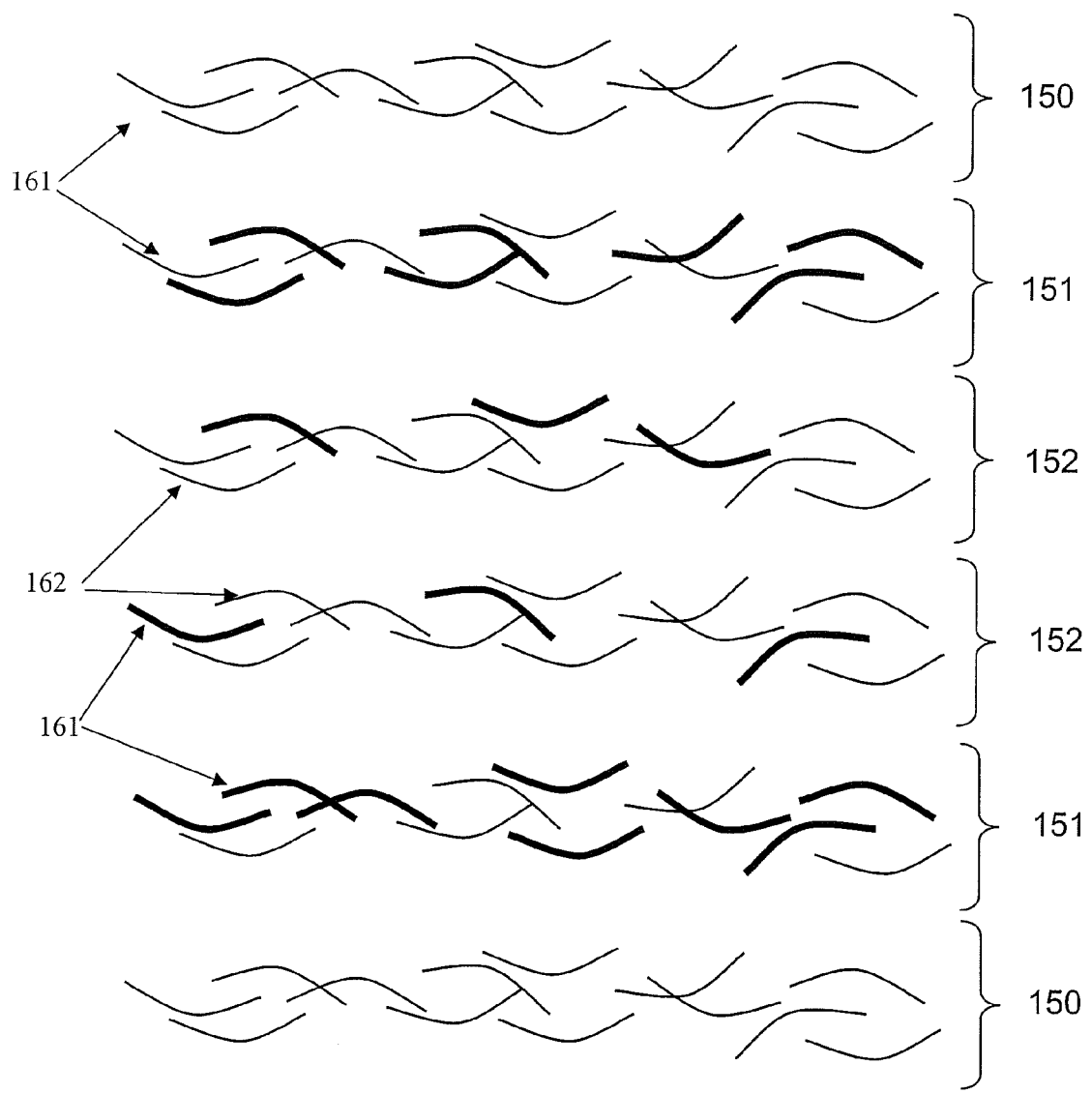
FIG. 7 is a schematic representation of another embodiment of a multi-layered structure as described herein.

Another exemplary multi-layered structure is schematically illustrated in FIG. 7. In contrast to the embodiment illustrated in FIG. 5, the multi-layered structure of FIG. 7 includes a plurality of nonwoven fabrics. Specifically, the multi-layered structure of FIG. 7 includes two nonwoven fabrics 150 that include a plurality of amorphous thermoplastic fibers 161 and no reinforcement fibers 162, two nonwoven fabrics 151 that include a small proportion of reinforcement fibers 162 in addition to amorphous thermoplastic fibers 162, and two fabrics 152 that include a high proportion of reinforcement fibers 162 in addition to amorphous thermoplastic fibers 161.

Following formation, a single layer or multi-layered structure including both an amorphous polymer component and reinforcement fibers can be shaped as desired and subjected to increased heat and pressure in a molding process. The particular molding parameters can be determined according to materials used in forming the structure. In one embodiment, a structure can to heated at least about that of the glass transition temperature of the amorphous thermoplastic polymer of the structure. In other embodiments, a structure can be heated to a temperature greater than the glass transition temperature of the amorphous thermoplastic polymer. For instance, a structure can be heated to a temperature that is greater than about 20° C. above the glass transition temperature of the amorphous thermoplastic polymer, or greater than about 40° C. above the glass transition temperature of the amorphous thermoplastic polymer in other embodiments.

During the molding process, the structure including both the amorphous thermoplastic polymer and the reinforcement fibers can also be subjected to increased pressure. For instance, a single layered or multi-layered structure can be subjected to a pressure of at least about 30 psi, or a pressure of about 50 psi in another embodiment. In other embodiments, the molding pressure can be higher, for instance greater than about 200 psi, or greater than about 250 psi. In one embodiment, the structure can be held under a pressure of between about 30 psi and about 1000 psi for a suitable amount of time, for instance for about 2 hours.

During molding, the amorphous thermoplastic polymer of the structure can begin to flow and individual formations including the polymer, e.g., individual fibers, filaments, films, etc. can begin to lose their integrity. Accordingly, the amorphous thermoplastic polymer of a single formation can amalgamate with adjacent polymers in the same or adjacent layers to form a polymeric matrix that can extend throughout an individual layer as well as between adjacent layers of a molded composite. Moreover, adjacent polymers that can consolidate and fuse to form a polymeric matrix can be the same or different. For instance, other polymers included the structure, in addition to one or more amorphous thermoplastic polymers, can describe a melt temperature or a glass transition temperature such that they also begin to flow during the molding process. As such, these other polymers can also coalesce and blend with neighboring polymers and become incorporated into the matrix formed during the molding process.

Figure 6:
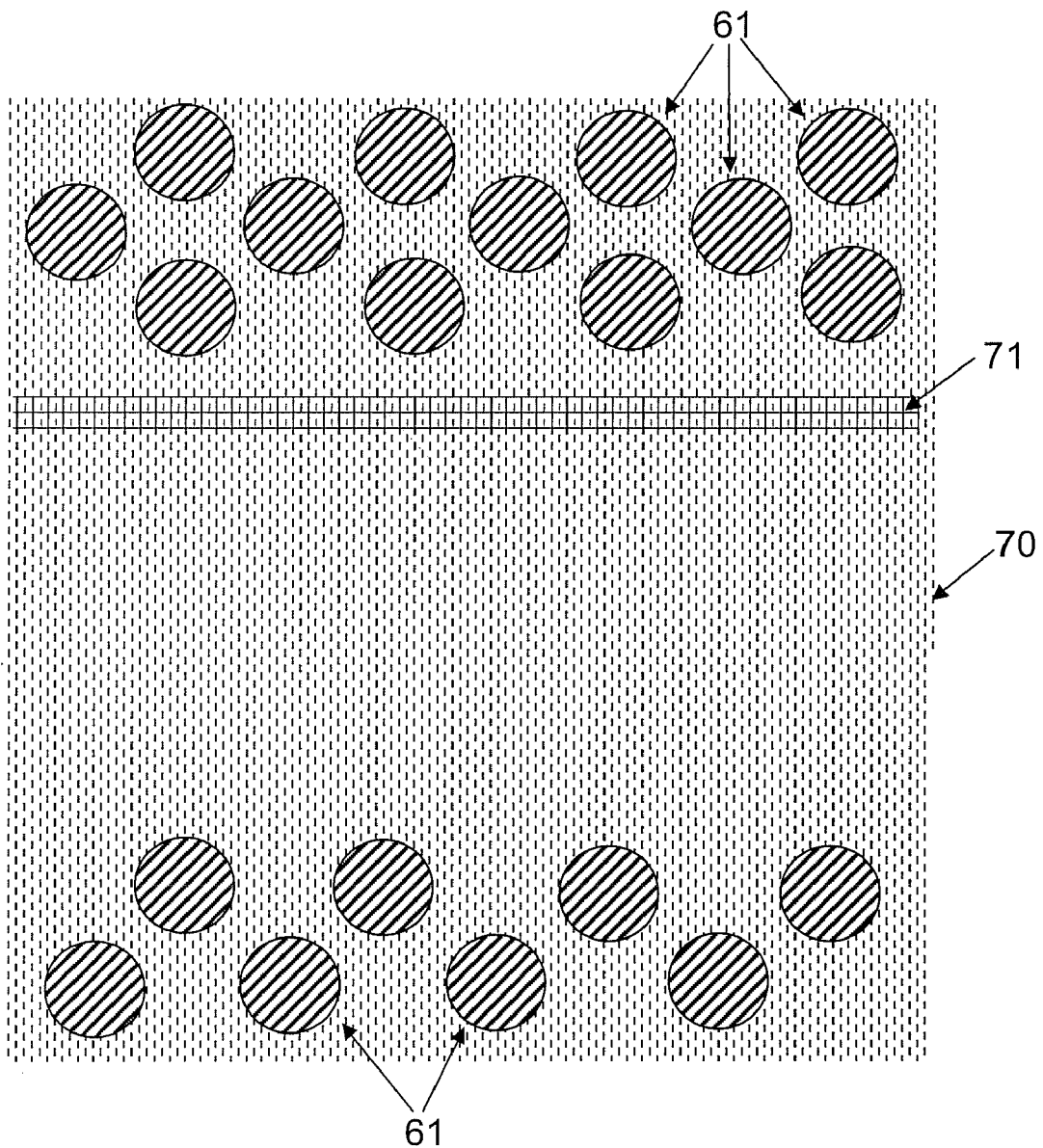
FIG. 6 is a schematic representation of a composite structure formed via compression molding of the multi-layered structure of FIG. 5.
Figure 8:
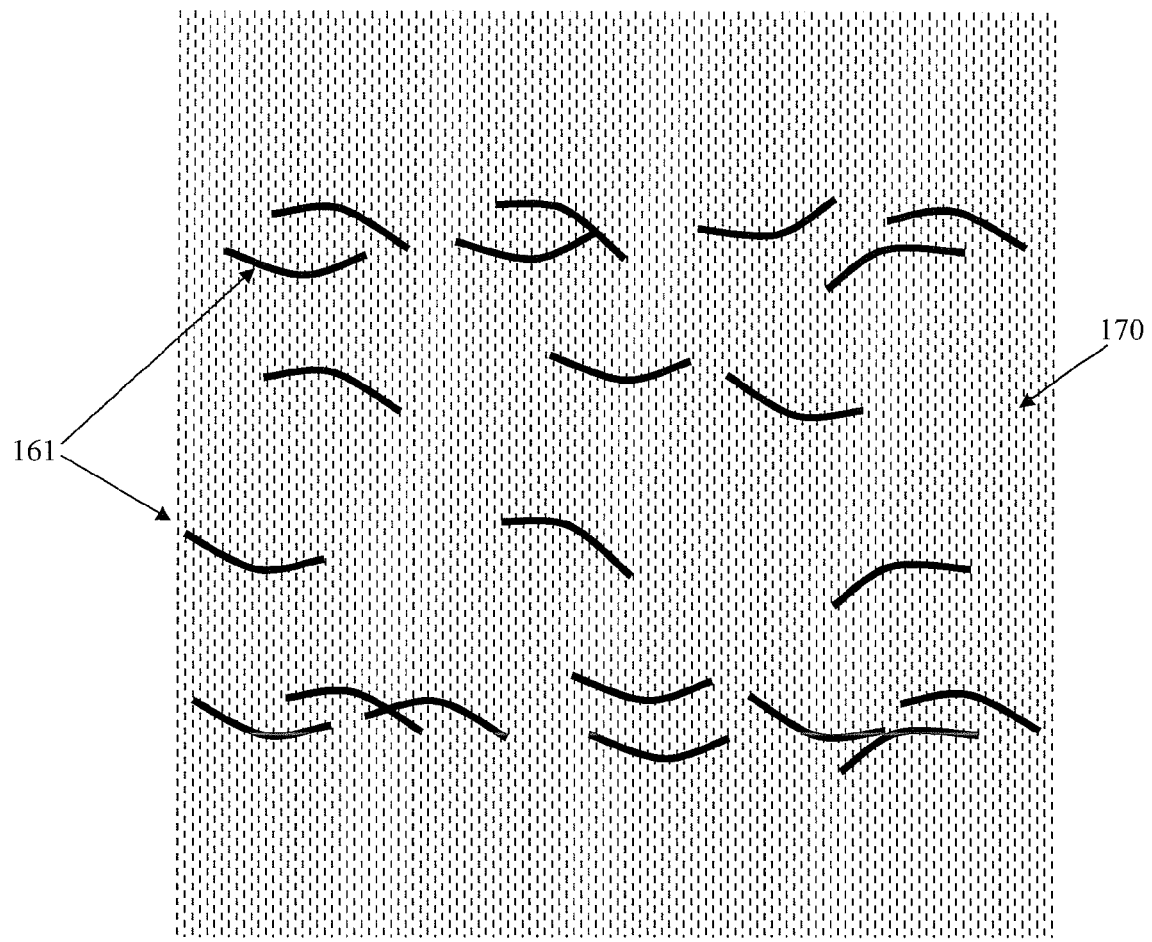
FIG. 8 is a schematic representation of a composite structure formed via compression molding of the multi-layered structure of FIG. 7.

FIG. 6 schematically illustrates the multi-layered structure of FIG. 5 following a molding process and FIG. 8 schematically illustrates the multi-layered structure of FIG. 7 following the molding process. As can be seen, the amorphous thermoplastic fibers 62, 162 have lost their integrity and coalesced to form an amorphous thermoplastic matrix 70, 170, respectively. During the molding process, amorphous thermoplastic polymers of the structure can flow to surround other non-flowing materials of the composite, and in particular, the high-strength reinforcement fibers 61 (FIG. 5) and 161 (FIG. 7). Thus, the amorphous polymeric matrix formed during the molding process can encompass and tightly bind the reinforcement fibers within the composite structure. Moreover, the formed composite can include the reinforcement fibers in a variety of distributions across the depth of the composite including, as shown, a higher concentration in the outer areas of the composite, as in FIG. 6, as well as a higher percentage in the inner areas of the composite, as in FIG. 8.

With regard to the composite material of FIG. 6, the second polymeric material that formed film layer 52 has also been incorporated into the matrix 70, as can be seen. The amorphous thermoplastic polymer of the original fibers 62 and the polymer of the original film 52 can meld and at least partially blend to form an area 71 within the matrix 70 that includes both polymers.

In addition to an amorphous polymer component and reinforcement fibers, composite materials can include additional components as desired. For instance, a multi-layered structure can include one or more layers in the form of fabrics, films, foils and the like that contain neither the amorphous polymer component nor the reinforcement fibers. Such layers can include, for instance, semi-crystalline thermoplastic polymers, thermoset polymers, liquid crystal materials, and the like that can provide desired characteristics to the final product. For instance, one or more layers of a multi-layered structure can be a fabric formed primarily of a semi-crystalline polymer. Possible thermoplastic fabrics and films for inclusion in a multi-layer structure can include those that are compatible with the other layers of the structure (i.e., will exhibit good adhesion to adjacent layers upon final formation). for example, low melt polyethylenes, low melt polypropylenes, or low melt fluoropolymers, as are generally known in the art may be included as a fabric or film layer. These additional layers can add desirable physical characteristics to the molded composite material such as tensile strength, flexural strength, or cross-direction permeation strength. For instance, the molded composite material can include one or more components specifically designed to increase resistance of the final composite structure to perforation or infiltration by a foreign substance (e.g., projectiles, liquid permeation, and the like).

Similarly, a single layer structure can include additional materials in combination with amorphous polymer fibers and/or reinforcement fibers. For instance, a composite fabric can include semi-crystalline polymer fibers in combination with amorphous polymer fibers and/or reinforcement fibers. Similarly, a composite yarn or fiber in any individual layer can include a secondary component such as a semi-crystalline polymer component. For example, a composite fiber in a core/sheath arrangement can include an inner amorphous polymer component and an outer semi-crystalline component describing a fairly low melt temperature, for instance a polyethylene having a melt temperature of about 135° C. The semi-crystalline constituent of the layer can then melt during the molding process and become a component of the polymeric matrix surrounding the remaining fibers of the composite. Multiple polymeric compositions are well known to those of ordinary skill in the art that have an appropriately low melting temperature for such an embodiment and are capable of being formed as fibers, and thus need not be described in detail herein.

The composite material can be formed in any desired shape and size. For instance, a formed composite structure can be substantially planar on a surface or can define a curved surface. The molded composite can be formed from a single fabric layer incorporating both an amorphous thermoplastic polymer component and reinforcement fibers or can be formed from a multi-layered construction. Thus, the molded substrate can have a thickness of from a few thousandths of an inch up to several inches, or even greater in certain embodiments. Moreover, the molded composite material can be flexible or inflexible, as desired.

In general, the polymeric matrix of a molded composite material can be considered to include the polymeric component of the matrix as well as any additives included with the polymeric component, i.e., all portions of the molded composite material excluding the reinforcement fibers contained within the composite. The polymeric matrix can generally include one or more amorphous thermoplastic polymers (i.e., any polymer that has an amorphous thermoplastic component) in an amount of at least about 80% by weight of the polymeric matrix. For instance, the polymeric matrix can include the amorphous thermoplastic polymer component in an amount greater than about 90% by weight of the matrix, in another embodiment.

Molded composite materials as formed herein can exhibit low dielectric constants and high thermal resistivity. For example, composites as described herein can exhibit a dielectric constant of less than about 4.0 in one embodiment. In another embodiment, the dielectric constant can be lower, for example, less than about 3.7, or even lower in other embodiments, for example less than about 3.5.

Composites disclosed herein can also have a low density, for example, less than about 1.7 g/cm³, in one embodiment. In another embodiment, the composites can have an even lower density, for instance less than about 1.5 g/cm³.

A low loss composite substrate as herein disclosed can be provided at a lower cost than many previously known low loss substrates due to the relatively low costs associated with amorphous polymeric materials as well as the low cost formation methods that can be used in forming the composites.

Additional materials can be printed, coated, soldered, or otherwise attached to the surface of the composite material following formation. For instance, electrically conductive materials can be formed, attached, printed or otherwise located on a surface of the composite material following the molding process to form a circuit on a surface of the composite. In this embodiment, a composite material as described herein can be utilized as a circuit board substrate. Circuit boards according to the present disclosure can include a molded composite material as described herein and an electrical circuit on a surface of the circuit board. Optionally, different conductive materials can be included on a single circuit that can also be placed in electrical communication with other circuits on or in the composite material, for instance via holes as is generally known in the industry.

In one particular embodiment, a circuit board as described herein can be utilized with high frequency circuits. For purposes of the present disclosure, the term 'high frequency' generally refers to a frequency of greater than about 100 KHz. In one embodiment, the composite material can be utilized in conjunction with higher frequency circuits, for example circuits operating at frequencies above about 1 MHz or even higher in other embodiments, for instance above about 1 GHz.

In general a circuit board can be used by first providing an electromagnetic signal of the appropriate frequency, transferring the signal to a circuit of the circuit board through wires, cables, solder joints, and/or other devices as are well known in the art, propagating the signal along the conductive arrangement of the circuit, which may include conductive strips and/or striplines as well as capacitors, transistors, and any other circuit components as are generally known in the art, and then receiving this signal at another element, which can be internal or external to the circuit board, as desired. External elements can include, for example, a computer chip, a memory chip, or any other external electrical device. The signal may optionally be provided via wireless communication from an antenna, or alternately a microwave power sources such as those available in integrated circuits or vacuum tubes, or any other sources as are generally known to those of ordinary skill in the art.

Circuit boards can provide the benefits of low dielectric constant and low dielectric loss, which can result in higher signal integrity, lower data loss, and lower circuit operating voltage, among other benefits that are well known in the art. The circuit boards can also have high thermal conductivity, for use in high temperature applications. The disclosed circuit boards can be an integral portion of a cellular telephone, or beneficially utilized in telephone switching equipment, computers, high power microwave devices, or any other electrical device operating in the microwave frequency as is generally known in the art.

Composite materials as disclosed herein can be used in forming a protective encasing structure that can protect the contents from weather, dirt, and/or other elements that could damage the devices held inside. As the composites can also be transparent to electromagnetic waves of various frequencies, the composites could be utilized to protect the encased electrical devices without impeding the operation of the devices. Such a protective encasement can include multiple composite structures in various combination. For instance, at least a portion of the encasement can be formed from a electromagnetically transparent composite including high strength reinforcement fibers such as glass, Kevlar®, UHMWPE, or the like held in an amorphous polymer matrix. In one embodiment, the reinforcement fibers can be provided such that, when viewed in cross section, the outer areas of the composite can contain a higher proportion of high strength reinforcement fibers, and the inner areas of the composite can contain a higher proportion of an amorphous thermoplastic polymer.

One particular example of an electromagnetically transparent protective structure is a radome within which an electromagnetic wave can be generated and transmitted from a dish antenna. The wave can pass through the radome, and in particular through that portion of the radome comprising a composite structure as described herein. Following wave reflection from an object such as a cloud or an aircraft, the wave can pass back through the radome again and be received again at the dish antenna.

Other known methods for transmitting and/or receiving electromagnetic waves can optionally be considered for various electrical applications, in addition to those associated with radar applications. For example, a protective structure as herein described could be utilized to house and protect lasers, masers, diodes, and other electromagnetic wave generation and/or receiving devices. In one particular embodiment, a protective structure as herein described can be utilized in conjunction with devices operating with radio frequency waves, such as those between about 100 kHz and about 100 GHz, or in one embodiment between about 1 MHz and about 50 GHz, or between about 10 MHz and about 20 GHz in another embodiment. Protective structures could be useful for protecting electrical equipment used to monitor weather patterns, to monitor air or ground traffic, or to detect the presence of aircraft, boats, or other vehicles around military facilities, including warships.

In another embodiment, a composite material as disclosed herein can be beneficially incorporated in an antenna. For instance, a composite material as herein described can be molded for use as an antenna base. Additionally, the composite material herein described can be molded for use as an antenna radome, or other component within the antenna structure, as is generally known in the art.

The present disclosure may be better understood with reference to the Example, below.

EXAMPLE

Topas® 6017 cyclic olefin copolymer was obtained from Ticona. Pellets were fed into a ¾" extruder with extruder temperature set to 190° C., 230° C. and 270° C. in extruder zones 1-3, and the melt pump and spin head heated to 290° C. The polymer was extruded through a spinneret with 15 orifices of 0.020" diameter, and passed through ~3 meters of room temperature air, then taken up on a first godet running at 1000 m/min and set at a temperature of 150° C. The yarn thus formed was then passed to a second godet, which was running at 1320 m/min and also set at 150° C., the yarn being drawn between the first and second godets. This first yarn was then passed over a third godet, running at 1320 m/min and at room temperature, and then wound on a bobbin. The drawn yarn was 125 denier in size. This yarn was twisted with a 450s glass yarn, and woven as a weft yarn across a style 1080 warp at 47 picks per inch. The weight of the resultant fabric was 70 g/m².

This fabric was cut into 4 inch by 6 inch pieces, layered, and placed into a mold at 200° C. and compressed at 500 psi for 2 hours. Two composites were made, one with 8 layers and the other with 18 layers. The dielectric properties and density of these composites were measured. Densities obtained indicated that there was air remaining in the resultant molded composites, as a composite with equal volume proportions of glass and cyclic olefin copolymer would have a predicted density of 1.75 g/cm3. Results are shown below in Table 1, along with the predicted values for a first composite including equal volume proportion of glass and COC (50%) and a second composite including 75% volume proportion COC and 25% volume proportion glass (25%) and a assuming these predicted samples had been fully compressed with no air remaining.

TABLE 1

|  | Testing Method | 8 Layer | 18 Layer | 50% | 75% |
|---|---|---|---|---|---|
| 100 MHz Dielectric Constant | IPC-4103 | 3.53 | 3.25 | 3.9 | 3.05 |
| Dielectric Loss |  | 0.0036 | 0.0041 | 0.002 | 0.0015 |
| Density (g/cm³) | ASTM D-792 | 1.5 | 1.5 | 1.75 | 1.4 |
| Flexural Strength (MPa) | ASTM D-790 | 119 | 120 |  |  |
| Flexural Modulus (GPa) | ASTM D-790 | 10.6 | 9.3 |  |  |
| Tensile Strength (MPa) | ASTM D-638 | 178 | 228 |  |  |
| Tensile Modulus (GPa) | ASTM D-638 | 12.4 | 10.9 |  |  |

It will be appreciated that the foregoing examples, given for purposes of illustration, are not to be construed as limiting the scope of this disclosure. Although only a few exemplary embodiments have been described in detail above, those skilled in the art will readily appreciate that many modifications are possible in the exemplary embodiments without materially departing from the novel teachings and advantages of this disclosure. Accordingly, all such modifications are intended to be included within the scope of this disclosure as is defined in the following claims and all equivalents thereto. Further, it is recognized that many embodiments may be conceived that do not achieve all of the advantages of some embodiments, yet the absence of a particular advantage shall not be construed to necessarily mean that such an embodiment is outside the scope of the present disclosure.

What is claimed is:

1. A composite substrate defining a first surface and an opposing second surface, the composite substrate comprising:
   a) a polymeric matrix that includes a fabric comprising fibers of polymer having a dielectric constant of less than 3.0, said polymer comprising an amorphous thermoplastic component, the polymeric matrix including said polymer in an amount of at least 80% by weight of the polymeric matrix, and
   b) reinforcement fibers contained within the polymeric matrix,
   wherein the composite substrate has a dielectric constant of less than 4.0.

2. The composite substrate of claim 1, wherein the composite substrate has a dielectric loss of less than 0.004.

3. The composite substrate of claim 1, wherein the polymer is a cyclic olefin copolymer.

4. The composite substrate of claim 1, wherein the reinforcement fibers comprise glass fibers.

5. The composite substrate of claim 1, wherein the composite substrate has a flexural modulus of greater than 9 GPa.

6. The composite substrate of claim 1, wherein the composite substrate has a density of less than 1.5 g/cm³.

7. The composite substrate of claim 1, wherein the composite substrate is a circuit board.

8. The composite substrate of claim 1, wherein the composite substrate is a portion of a radome or a portion of an antenna.

9. A composite substrate defining a first surface and an opposing second surface, the composite substrate comprising:
   a) a polymeric matrix that includes a fabric comprising fibers of polymer having a dielectric constant of less than 3.0, said polymer comprising an amorphous thermoplastic component, the polymeric matrix including said polymer in an amount of at least about 80% by weight of the polymeric matrix, and
   b) woven reinforcement fibers contained within the polymeric matrix,
   wherein the composite substrate has a dielectric constant of less than 4.0.

10. The composite substrate of claim 9, wherein the composite substrate has a dielectric loss of less than 0.004.

11. The composite substrate of claim 9, wherein the polymer has a dielectric constant of less than 2.9.

12. The composite substrate of claim 9, wherein the polymer is a cyclic olefin copolymer.

13. The composite substrate of claim 9, wherein the reinforcement fibers comprise glass fibers.

14. The composite substrate of claim 9, wherein the composite substrate has a flexural modulus of greater than 9 GPa.

15. The composite substrate of claim 9, wherein the composite substrate has a density of less than 1.5 g/cm³.

16. The composite substrate of claim 9, wherein the composite substrate is a circuit board.

17. The composite substrate of claim 9, wherein the composite substrate is a portion of a radome or a portion of an antenna.

18. A composite substrate defining a first surface and an opposing second surface, the composite substrate comprising:
   a) a polymeric matrix that includes a polymer having a dielectric constant of less than 3.0, said polymer comprising an amorphous thermoplastic component, the polymeric matrix including said polymer in an amount of at least 80% by weight of the polymeric matrix, and
   b) reinforcement fibers contained within the polymeric matrix,
   wherein the reinforcement fibers are distributed within the composite substrate such that the average concentration gradient of the reinforcement fibers between the first surface and the second surface is about zero and the composite substrate has a dielectric constant of less than 4.0.

19. The composite substrate of claim 18, wherein the composite substrate has a dielectric loss of less than 0.004.

20. The composite substrate of claim 18, wherein the polymer has a dielectric constant of less than 2.9.

21. The composite substrate of claim 1, wherein the reinforcement fibers comprise glass fibers.

22. The composite substrate of claim 18, wherein the composite substrate has a flexural modulus of greater than 9 GPa.

23. The composite substrate of claim 18, wherein the composite substrate has a density of less than 1.5 g/cm$^3$.

24. The composite substrate of claim 18, wherein the composite substrate is a circuit board.

25. The composite substrate of claim 18, wherein the composite substrate is a portion of a radome or a portion of an antenna.

26. A composite substrate defining a first surface and an opposing second surface, the composite substrate comprising:
 a) a polymeric matrix that includes a polymer having a dielectric constant of less than 3.0, said polymer comprising an amorphous thermoplastic component, the polymeric matrix including said polymer in an amount of at least 80% by weight of the polymeric matrix, and
 b) reinforcement fibers contained within the polymeric matrix,
 wherein the ratio of the polymeric matrix to the reinforcement fibers is greater at the first surface than at an interior area of the composite substrate and the composite substrate has a dielectric constant of less than 4.0.

27. The composite substrate of claim 26, wherein the composite substrate has a dielectric loss of less than 0.004.

28. The composite substrate of claim 26, wherein the polymer has a dielectric constant of less than 2.9.

29. The composite substrate of claim 26, wherein the reinforcement fibers comprise glass fibers.

30. The composite substrate of claim 26, wherein the composite substrate has a flexural modulus of greater than 9 GPa.

31. The composite substrate of claim 26, wherein the composite substrate has a density of less than 1.5 g/cm$^3$.

32. The composite substrate of claim 26, wherein the composite substrate is a circuit board.

33. The composite substrate of claim 26, wherein the composite substrate is a portion of a radome or a portion of an antenna.

* * * * *